United States Patent
Wang et al.

(10) Patent No.: US 9,666,426 B2
(45) Date of Patent: May 30, 2017

(54) METHODS AND APPARATUS FOR UNIFORMLY METALLIZATION ON SUBSTRATES

(75) Inventors: Hui Wang, Shanghai (CN); Yue Ma, Shanghai (CN); Chuan He, Shanghai (CN); Xi Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 608 days.

(21) Appl. No.: 14/127,285

(22) PCT Filed: Jun. 24, 2011

(86) PCT No.: PCT/CN2011/076262
§ 371 (c)(1),
(2), (4) Date: Apr. 1, 2014

(87) PCT Pub. No.: WO2012/174732
PCT Pub. Date: Dec. 27, 2012

(65) Prior Publication Data
US 2014/0216940 A1    Aug. 7, 2014

(51) Int. Cl.
*C25D 7/12* (2006.01)
*C25D 5/20* (2006.01)
(Continued)

(52) U.S. Cl.
CPC ............... *H01L 21/02* (2013.01); *C25D 5/08* (2013.01); *C25D 5/18* (2013.01); *C25D 5/20* (2013.01);
(Continued)

(58) Field of Classification Search
CPC ..................... C25D 5/20; C25D 7/12–7/126
See application file for complete search history.

(56) References Cited

U.S. PATENT DOCUMENTS

| 3,933,601 A | 1/1976 | Ishibashi et al. |
| 5,965,043 A | 10/1999 | Noddin et al. |

(Continued)

FOREIGN PATENT DOCUMENTS

| CN | 101263246 A | 9/2008 |
| CN | 101308108 A | 11/2008 |

(Continued)

OTHER PUBLICATIONS

Lou, Electroplating, Encyclopedia of Chem. Processing (2006).*
(Continued)

*Primary Examiner* — James Lin
*Assistant Examiner* — Ho-Sung Chung
(74) *Attorney, Agent, or Firm* — Osha Liang LLP

(57) ABSTRACT

An apparatus for substrate metallization from electrolyte is provided. The apparatus comprises: an immersion cell containing metal salt electrolyte; at least one electrode connecting to at least one power supply; an electrically conductive substrate holder holding at least one substrate to expose a conductive side of the substrate to face the at least one electrode; an oscillating actuator for oscillating the substrate holder with an amplitude and a frequency; at least one ultrasonic device with an operating frequency and an intensity, disposed in the metallization apparatus; at least one ultrasonic power generator connecting to the ultrasonic device; at least one inlet for metal slat electrolyte feeding; and at least one outlet for metal salt electrolyte draining.

16 Claims, 17 Drawing Sheets

(51) Int. Cl.
  *H01L 21/02* (2006.01)
  *C25D 17/00* (2006.01)
  *C25D 5/08* (2006.01)
  *C25D 5/18* (2006.01)
  *C25D 17/06* (2006.01)
  *C25D 21/10* (2006.01)

(52) U.S. Cl.
  CPC ............... *C25D 7/12* (2013.01); *C25D 17/00* (2013.01); *C25D 17/001* (2013.01); *C25D 17/002* (2013.01); *C25D 17/008* (2013.01); *C25D 17/06* (2013.01); *C25D 21/10* (2013.01)

(56) References Cited

U.S. PATENT DOCUMENTS

| | | | |
|---|---|---|---|
| 6,261,433 B1* | 7/2001 | Landau | C25D 3/38 204/230.2 |
| 6,391,166 B1 | 5/2002 | Wang | |
| 6,398,937 B1 | 6/2002 | Menini et al. | |
| 6,683,384 B1 | 1/2004 | Kossives et al. | |
| 7,445,697 B2 | 11/2008 | Keigler et al. | |
| 7,727,863 B1* | 6/2010 | Buckalew | C23C 18/1666 257/414 |
| 8,574,418 B2 | 11/2013 | Monchoix et al. | |
| 2001/0045360 A1* | 11/2001 | Omasa | C25D 5/08 205/108 |
| 2003/0038038 A1* | 2/2003 | Basol | C25D 5/02 205/125 |
| 2004/0072419 A1* | 4/2004 | Baskaran | C25D 3/38 438/627 |
| 2004/0099534 A1* | 5/2004 | Powers | C25D 17/10 205/157 |
| 2005/0173806 A1 | 8/2005 | Matsubara | |
| 2006/0175201 A1* | 8/2006 | Hafezi | C25D 5/18 205/102 |
| 2007/0170066 A1 | 7/2007 | Beaudry et al. | |
| 2008/0271995 A1 | 11/2008 | Savastiouk et al. | |
| 2009/0139870 A1* | 6/2009 | Nagai | C23C 14/046 205/131 |
| 2009/0250352 A1* | 10/2009 | Dubin | C25D 3/38 205/143 |
| 2010/0038256 A1 | 2/2010 | Monchoix et al. | |

FOREIGN PATENT DOCUMENTS

| | | | | |
|---|---|---|---|---|
| CN | 101927242 A | | 12/2010 | |
| CN | 101956225 A | | 1/2011 | |
| JP | H05-267264 A | | 10/1993 | |
| JP | H07-13350 A | | 1/1995 | |
| JP | H09-294965 A | | 11/1997 | |
| JP | H11-80968 | * | 3/1999 | ............. C23C 18/31 |
| JP | H11-80968 A | | 3/1999 | |
| JP | H11-179305 A | | 7/1999 | |
| JP | H11-217692 A | | 8/1999 | |
| JP | 37-14991 B2 | | 11/2005 | |
| JP | 48-73339 B2 | | 2/2012 | |
| JP | 50-76857 B2 | | 11/2012 | |
| WO | 2005/042804 A2 | | 5/2005 | |
| WO | 2009/055992 A1 | | 5/2009 | |

OTHER PUBLICATIONS

Hongo, JP H11-80968, English abstract and machine translation (1999).*

International Search Report mailed Apr. 5, 2012, issued by The State Intellectual Property Office of the People's Republic of China, for corresponding International Application No. PCT/CN2011/076262 (3 pages).

Chen, Qianwen, et al., "The influence of ultrasonic agitation on copper electroplating of blind-vias for SOI three-dimensional integration"; Microelectronic Engineering, vol. 87 (2010); DOI: 10.1016/j.mee.2009.06.035; pp. 527-531.

Pollet, B. G., et al., "Transport Limited Currents Close to an Ultrasonic Horn Equivalent Flow Velocity Determination"; Journal of the Electrochemical Society, vol. 154, No. 10, (2007), E131-E138.

First Office Action issued Feb. 10, 2015, by the Japan Patent Office in corresponding Japanese Patent Application No. JP 2014-516156, with Google English machine-translation (7 pages).

Office Action issued in Chinese Application No. 201110365926.7; Dated Apr. 1, 2016 (6 pages).

* cited by examiner

METHODS AND APPARATUS FOR UNIFORMLY METALLIZATION ON SUBSTRATES

FIELD OF THE INVENTION

The present invention generally relates to an apparatus and a method for metallization of substrate from electrolyte solutions. More particularly, it relates to applying at least one ultrasonic device to a metallization apparatus to achieve highly uniform metallic film deposition at a rate far greater than conventional film growth rate in electrolyte solutions.

BACKGROUND

Forming of a metallic layer onto a substrate bearing a thin conductive layer, usually copper, in an electrolyte environment, is implemented to form conductive lines during ULSI (ultra large scale integrated) circuit fabrication. Such a process is used to fill cavities, such as vias, trenches, or combined structures of both by electrochemical methods, with an overburden film covering the surface of the substrate. It is critical to obtain a uniform final deposit film because the subsequent process step, commonly a planarization step (such as CMP, chemical-mechanical planarization) to remove the excess conductive metal material, requires a high degree of uniformity in order to achieve the equal electrical performance from device to device at the end of production line.

Currently, metallization from electrolyte solutions is also employed in filling TSV (through silicon via) to provide vertical connections to the 3-D package of substrate stacks. In TSV application, via opening has a diameter of a few micrometers or larger, with via depth as deep as several hundreds of micrometers. The dimensions of TSV are orders of magnitude greater than those in a typical dual damascene process. It is a challenge in TSV technology to perform metallization of cavities with such high aspect ratio and depth close to the thickness approaching that of the substrate itself. The deposition rates of metallization systems designed for use in typical dual damascene process, usually a few thousand angstroms per minute, is too low to be efficiently applied in TSV fabrication.

To achieve the void-free and bottom-up gapfill in deep cavities, multiple organic additives are added in the electrolyte solutions to control the local deposition rate. During deposition, these organic components often break down into byproduct species that can alter the desired metallization process. If incorporated into deposited film as impurities, they may act as nuclei for void formation, causing device reliability failure. Therefore, during the deposition process high chemical exchange rate of feeding fresh chemicals and removing break-down byproducts in and near the cavities is needed.

In addition, with high aspect ratio, vortex is formed inside the cavities below where steady electrolyte flow passes on top of the cavity openings. Convection hardly happens between the vortex and the main flow, and the transport of fresh chemicals and break-down byproducts between bulk electrolyte solution and cavity bottom is mainly by diffusion. For deep cavity such as TSV, the length for diffusion path is longer, further limiting the chemical exchange within the cavity. Moreover, the slow diffusion process along the long path inside TSV hinders the high deposition rate required by economical manufacturing.

The maximum deposition rate by electrochemical methods in a mass-transfer limited case is related to the limiting current density, which is inversely proportional to diffusion double layer thickness for a given electrolyte concentration. The thinner the diffusion double layer, the higher the limiting current density, thus the higher the deposition rate possible. Various means to enhance fluid agitation to reduce the diffusion double layer thickness has been disclosed.

One method disclosed by U.S. Pat. No. 7,445,697 and WO/2005/042804 is by oscillating a series of paddles, termed as "shearplate", near the stationary substrate surface of interest. It is recited that at 800 repetitions of these paddles the double layer thickness can be as thin as 10 micrometers. Although thinning the boundary layer thickness improves the deposition rate, the uniformity of deposited film is difficult to control since the substrate does not rotate.

Another fluid agitation method that has been widely disclosed is ultrasonic agitation, i.e. U.S. Pat. No. 6,398,937 and U.S. Pat. No. 5,965,043. This method is commonly practiced in various electrochemical metallization applications including printed circuit boards (PCB) and substrate packaging processes. Metallization of copper under ultrasonic agitation has drawn particular attention due to its importance in TSV applications ("The influence of ultrasonic agitation on copper electroplating of blind-vias for SOI three-dimensional integration" By Chen, Q. et. al. Microelectronic Engineering, Vol 87(3), Pages 527-531, 2010).

Although ultrasonic agitation further reduces the diffusion double layer thickness by forming acoustic streaming layer near reacting surface and by local cavitation bubble implosion, it does not provide uniform treatment to fluid near reacting surface. The nature of the acoustic wave propagation and its combination with reflected wave cause different energy dosage at different locations on reacting surface. The local deposition rate is not only a function of ultrasonic frequency but also directly related to the energy dosage at that point. This standing wave phenomenon leads to areas of various deposition rate across reacting surface. Above the energy threshold which cavitation will occur, bubble implosion takes place in a more or less random fashion, making overall process control very difficult.

Applying ultrasonic to electrochemical processes for the enhancement of mass transport has been well studied. Correlation between limiting current and operating parameters of an ultrasonic source has been established in a paper entitled "Transport Limited Currents Close to an Ultrasonic Horn Equivalent Flow Velocity Determination", by B. G. Pollet et. al. in Journal of The Electrochemical Society, Vol. 154 (10), pp. E131-E138, 2007. The acoustic intensity (or energy dosage) received by reacting surface is sensitive to the gap between the ultrasonic source and reacting surface; hence, the limiting current density varies with that gap. This presents a greater challenge to forming uniform deposition using previously disclosed ultrasonic-assisted (UA) deposition methods (US 2008/0271995 and US 2007/0170066). In practice of substrate metallization process, the substrate rotation plane and the surface of ultrasonic source cannot be perfectly in parallel, largely due to mechanical tolerance in planar fixation and vertical alignment of rotation axis, as well as substrate warping itself. Thus within-substrate-uniformity of the deposited film is hard to control during such metallization processes.

UA metallization is an attractive method to be applied to processes such as filling TSV where rapid metallization and high chemical exchange rate are required. The diffusion double layer thickness in UA metallization can be reduced to a much smaller value than other methods, such as rotating substrate at high rpm or oscillating paddlers at substrate surface, therefore a higher deposition rate is warranted. The local agitation by acoustic stream and bubble implosion also create mass transport means other than diffusion inside deep vias and thus increase material exchange rate there.

With this method; however, a way of controlling deposition uniformity must be found for it to be applied to aforementioned processes.

SUMMARY

The present invention relates to applying at least one ultrasonic device to a metallization apparatus to achieve highly uniform metallic film deposition at a rate far greater than conventional film growth rate in electrolyte solutions. In the present invention, the semiconductor substrate is dynamically controlled so that the position of the semiconductor substrate varies at a programmed increment or decrement at each revolution of the substrate in the metallization apparatus. This method guarantees each location of the substrate to receive the same amount of total acoustic energy over the interval of the process time, and to accumulatively grow a uniform deposition thickness at a rapid rate.

The high deposition rate is achieved by destroying the electrolyte diffusion boundary layer near the substrate surface and reform an alternative thin boundary layer by acoustic streaming due to cavitation and bubble implosion near substrate surface. The high flow velocity of the acoustic streaming generated by the ultrasonic device increases the chemical exchange rate by enhancing convection of fresh chemicals and byproducts inside vias and trenches. It also enhances the gapfill performance by efficiently preventing break-down byproducts from being incorporated into deposit film.

One embodiment of the present invention is to move the substrate periodically during the electrochemical deposition process. It ensures the same receiving acoustic intensity on substrate surface in a certain cumulative time, which enhances the deposited film uniformity.

According to one embodiment of the present invention, an apparatus for substrate metallization from electrolyte is provided. The apparatus comprises: an immersion cell containing metal salt electrolyte; at least one electrode connecting to at least one power supply; an substrate holder holding at least one substrate to expose a conductive side of the substrate to face the at least one electrode, the substrate holder being electricity conducting; an oscillating actuator oscillating the substrate holder with an amplitude and a frequency; at least one ultrasonic device with an operating frequency and an intensity, disposed in a position in the metallization apparatus; at least one ultrasonic power generator connecting to the ultrasonic device; at least one inlet for metal salt electrolyte feed; and at least one outlet for metal salt electrolyte drain.

According to one embodiment of the present invention, a method for substrate metallization from electrolyte is provided. The method comprises: flowing a metal salt electrolyte into an immersion cell; transferring at least one substrate to a substrate holder that is electrically in contact with a conductive layer on a surface of the substrate; applying a first bias voltage to the substrate; bringing the substrate into contact with the electrolyte; applying an electrical current to electrode; applying ultrasonic to the substrate and oscillating the substrate holder; stop applying the ultrasonic and stopping oscillation of the substrate holder; applying a second bias voltage on the semiconductor substrate; bringing the substrate out of the metal salt electrolyte. In one or more embodiments of the method, the first bias voltage is the first bias voltage is 0.1V to 10V, the electrical current is 0.1 A to 100 A, the ultrasonic wave has an operating frequency of 5 KHz to 5 MHz and an intensity of 0.1 to 3 W/cm2, the substrate oscillates with an amplitude of 0.25 mm to 25 mm and a frequency is 0.01 to 0.5 Hz, and the second bias voltage is 0.1V to 5V. In one or more embodiments of the method, the method includes rotating the substrate and bringing the substrate into contact with the electrolyte, wherein the substrate is rotated at a speed of 10 to 300 rpm. In one or more embodiments of the method, the metal salt electrolyte contains at least one cationic form of the following metals: Cu, Au, Ag, Pt, Ni, Sn, Co, Pd, Zn. In one or more embodiments of the method, cavities on the substrate have dimensions of 0.5 to 50 μm in width and 5 to 500 μm in depth. In one or more embodiments of the method, the substrate holder oscillates at constant speed equal to $$n \cdot \frac{N\lambda}{t},$$

where λ is the wavelength of the ultrasonic wave and t is the full process time, and n and N are integers. In one or more embodiments of the method, the electrical current is applied in DC mode. In one or more embodiments of the method, the electrical current is applied in pulse reverse mode with a pulse period of 5 ms to 2 s. In one or more embodiments of the method, electrolyte agitation is provided proximate cavities on the substrate. In one or more embodiments of the method, electrolyte agitation is provided inside cavities on the substrate. In one or more embodiments of the method, material exchange rate of reactants and byproducts between an inside and an outside of cavities on the substrate are increased. In one or more embodiments of the method, impurity levels in deposit in cavities on the substrate are reduced. In one or more embodiments of the method, a diffusion boundary layer with a thickness of 0.1 to 10 micrometers is reformed proximate the surface of the substrate. In one or more embodiments of the method, metal deposition rate is increased by increasing limiting current density. In one or more embodiments of the method, an acoustic intensity received by the substrate is uniform over the course of the method. In one or more embodiments of the method, a metalized film with uniform thickness is formed.

DETAILED DESCRIPTION OF EMBODIMENTS

According to the embodiments of the present invention, ultrasonic devices are utilized, an example an ultrasonic device that may be applied to the present invention is described in U.S. Pat. No. 6,391,166 and WO/2009/055992.

Figure 1A:
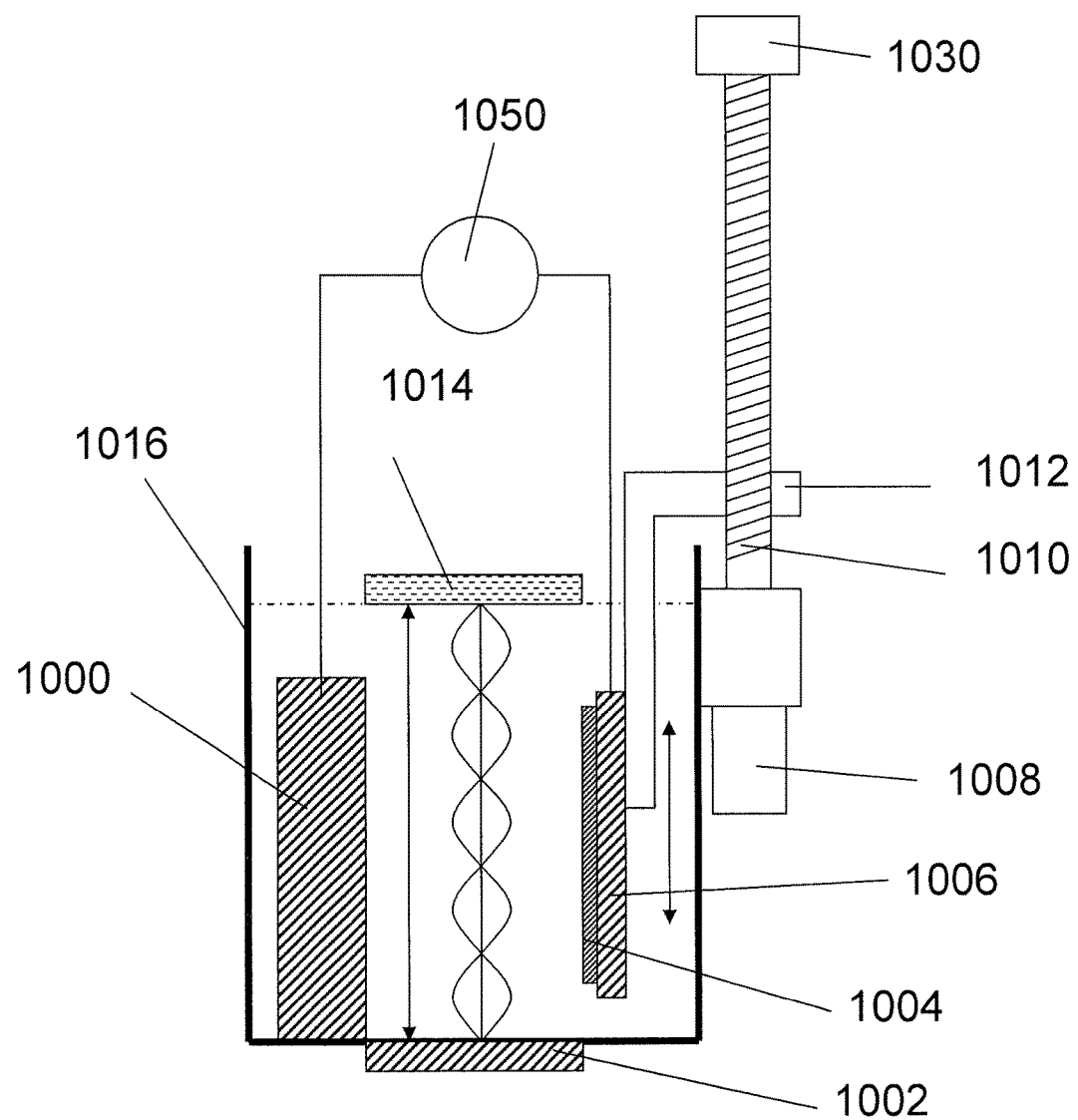
FIG. 1a-1c show one exemplary apparatus for metallization of substrate from electrolyte solutions.
Figure 1B:
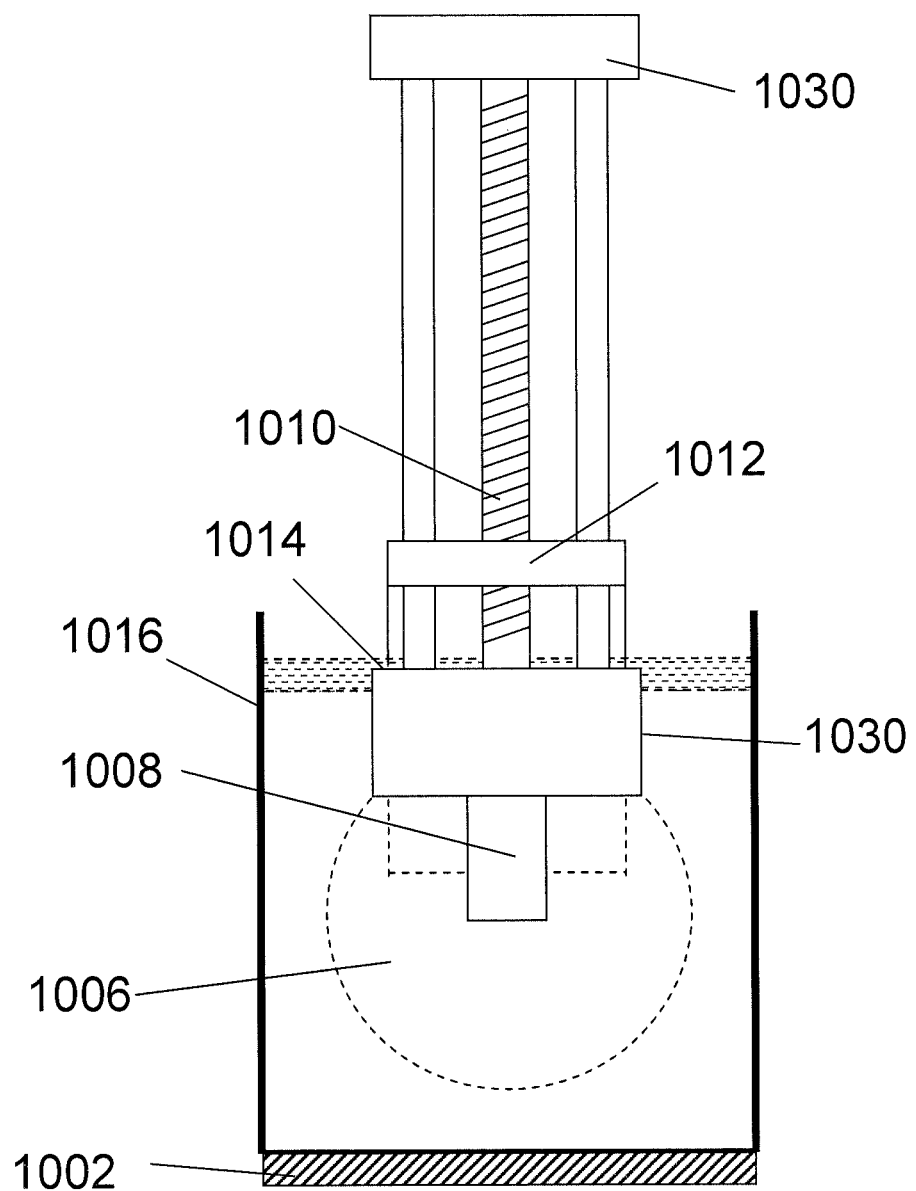
Figure 1C:
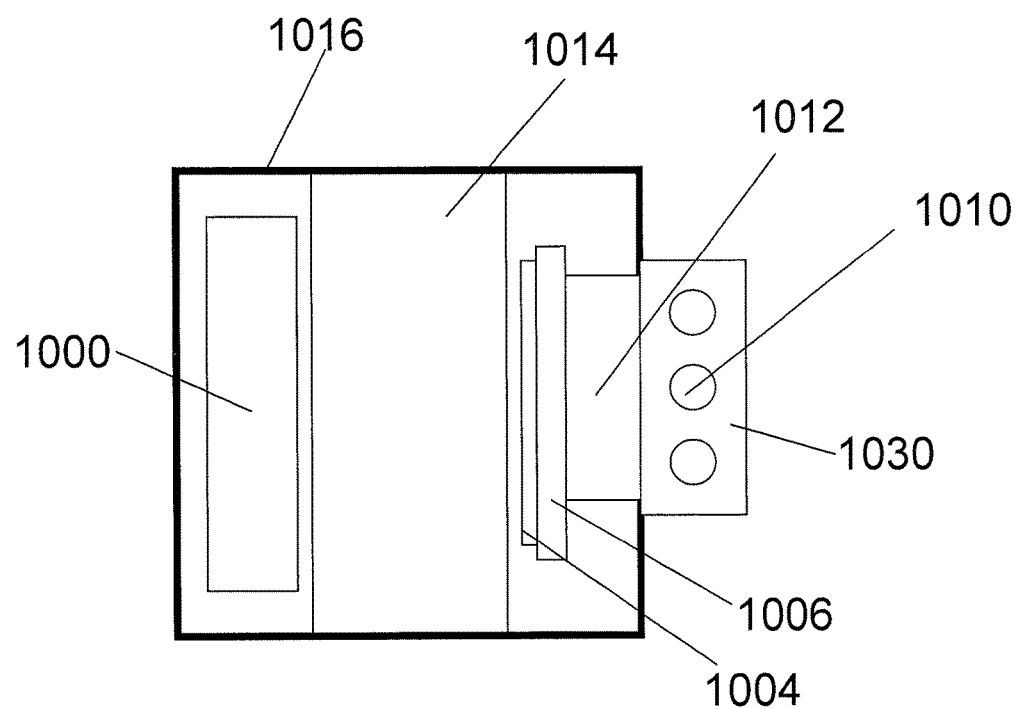

FIG. 1a-1c show an exemplary apparatus for substrate metallization from electrolyte according to an embodiment of the present invention. The apparatus includes an ultrasonic device 1002. The apparatus for substrate metallization from electrolyte normally comprises an immersion cell 1016 containing at least one metal salt electrolyte, at least one electrode 1000 connecting to independent power supply 1050, an electricity conducting substrate holder 1006 holding the substrate 1004 to expose its conductive side to face said electrode 1000. The metal salt electrolyte flows from chamber bottom to chamber top. At least one inlet and one outlet are positioned in the cell for electrolyte circulation. The substrate holder 1006 is connected to an oscillating actuator 1010, and the substrate holder 1006 is oscillated by an oscillating actuator 1010 with an amplitude from 0.25 to 25 mm and a frequency from 0.01 to 0.5 Hz. It holds substrate 1004 to move up and down periodically along a direction which is perpendicular to the bottom plane of the metallization apparatus during process. The independent power supply 1050 connects to at least one electrode 1000 and works in voltage-controlled mode or current-controlled mode with pre-programmed waveforms, and switch between the two modes at desire time. The applying electrical current is operable in DC mode or pulse reverse mode with pulse period from 5 ms to 2 s. The ultrasonic device 1002 is fixed in a position at the sidewall of the metallization apparatus, to generate the ultrasonic wave with a frequency from 10 KHz to 5 MHz and an intensity from 0.1 to 3 W/cm2. An example of the metallization apparatus from electrolyte solutions to apply the ultrasonic device is described in U.S. Pat. No. 6,391,166 and WO/2009/055992.

Figure 2A:
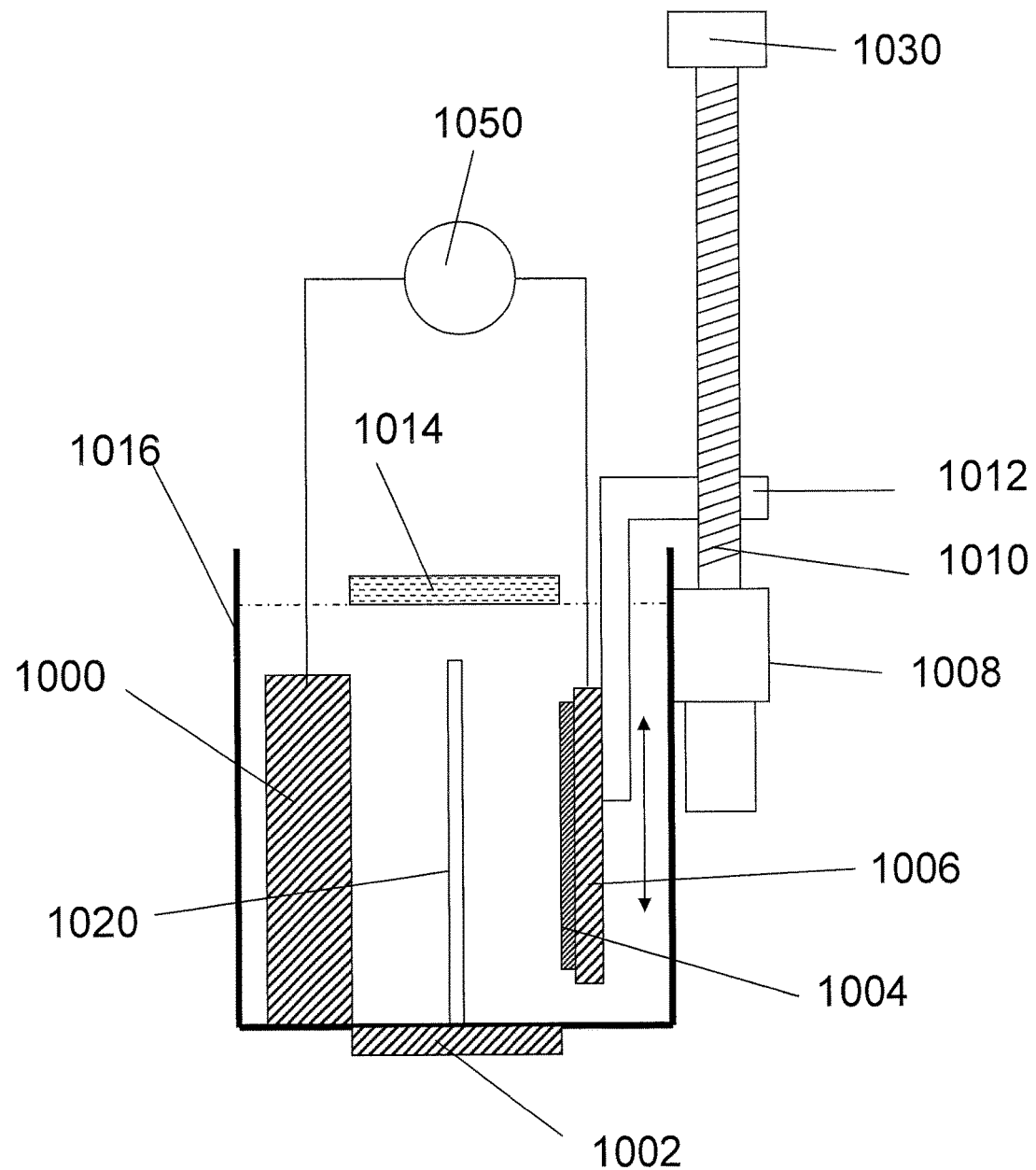
FIG. 2a-2b show another exemplary apparatus for metallization of substrate from electrolyte solutions and the solution distribution plate in the apparatus.
Figure 2B:
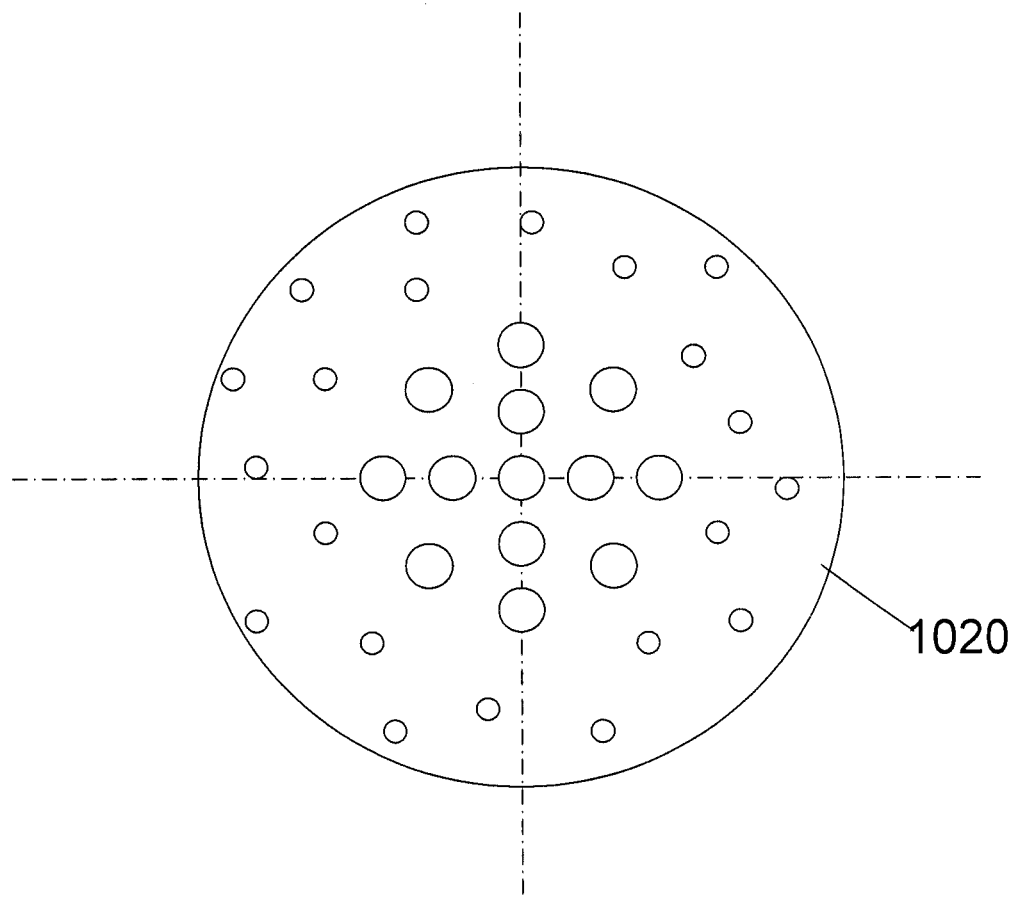

FIG. 2a shows another exemplary apparatus for substrate metallization from electrolyte according to an embodiment of the present invention. The apparatus includes an ultrasonic device 1002. The apparatus for substrate metallization from electrolyte normally comprises an immersion cell 1016 containing at least one metal salt electrolyte, at least one electrode 1000 connecting to independent power supply 1050, an electricity conducting substrate holder 1006 holding the substrate 1004 to expose its conductive side to face said electrode 1000. The metal salt electrolyte flows from chamber bottom to chamber top. At least one inlet and one outlet are positioned in the cell for electrolyte circulation. The substrate holder 1006 is connected to an oscillating actuator 1010, and the substrate holder 1006 is oscillated by an oscillating actuator 1010 with an amplitude from 0.25 to 25 mm and a frequency from 0.01 to 0.5 Hz. It holds substrate 1004 to move up and down periodically along z direction during process which is perpendicular to the bottom plane of the metallization apparatus. There is a shielding plate 1020 in between the anode 1000 and the substrate 1004 in the metallization apparatus, providing a uniform electrical field distribution across the substrate 1004 surface. FIG. 2b shows an exemplary design of the shielding plate 1020. The independent power supply 1050 connects to at least one electrode 1000 and works in voltage-controlled mode or current-controlled mode with pre-programmed waveforms, and switch between the two modes at desire time. The applying electrical current is operable in DC mode or pulse reverse mode with pulse period from 5 ms to 2 s. The ultrasonic device 1002 is fixed in a position at the sidewall of the metallization apparatus, to generate the ultrasonic wave with a frequency from 10 KHz to 5 MHz and an intensity from 0.1 to 3 W/cm2.

Figure 3:
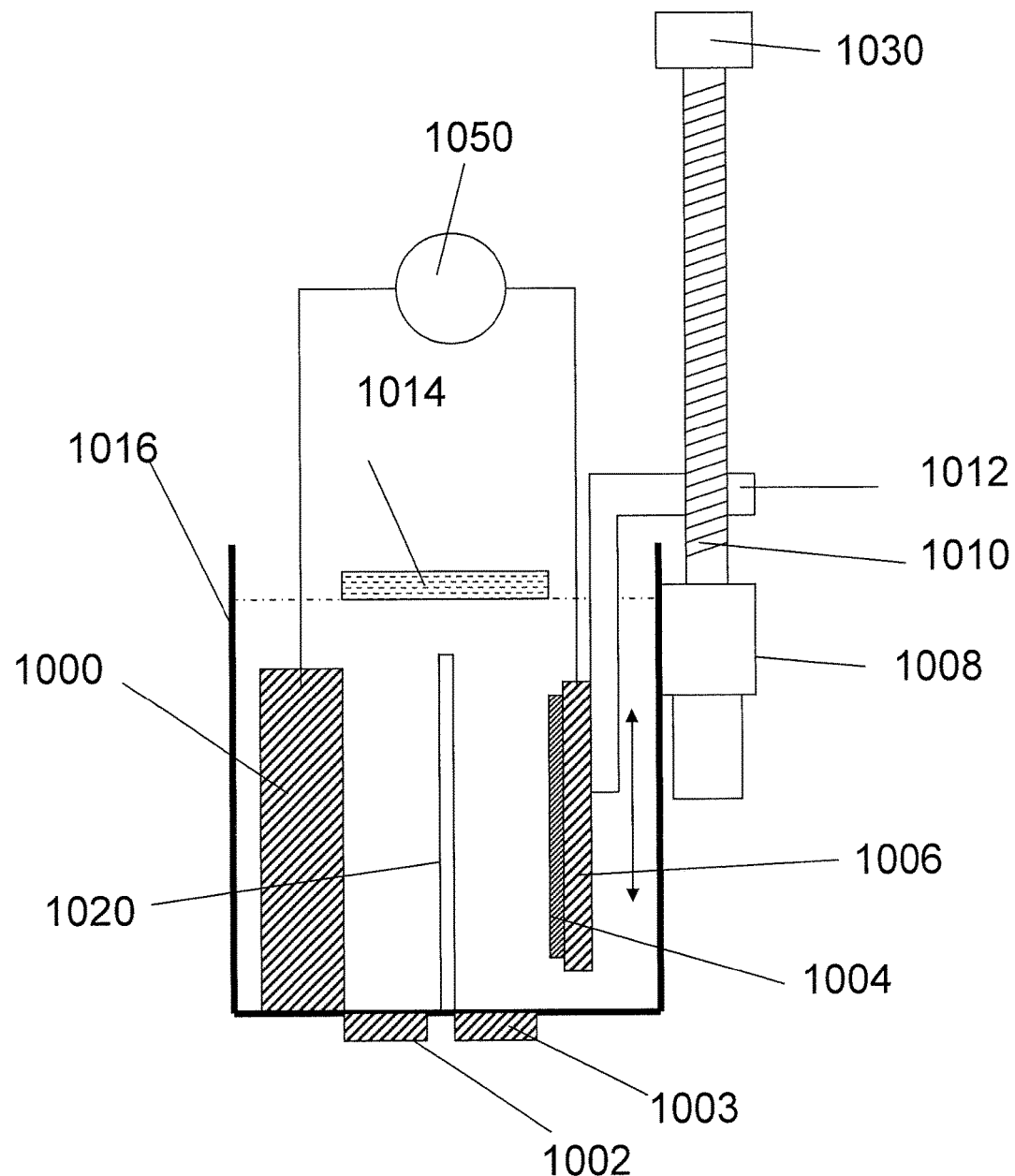
FIG. 3 show another exemplary apparatus for metallization of substrate from electrolyte solutions.

FIG. 3 shows another exemplary apparatus for substrate metallization from electrolyte according to an embodiment of the present invention. The apparatus includes two ultrasonic devices 1002 and 1003. The apparatus for substrate metallization from electrolyte normally comprises an immersion cell 1016 containing at least one metal salt electrolyte, at least one electrode 1000 connecting to independent power supply 1050, an electricity conducting substrate holder 1006 holding the substrate 1004 to expose its conductive side to face said electrode 1000. The metal salt electrolyte flows from chamber bottom to chamber top. At least one inlet and one outlet are positioned in the cell for electrolyte circulation. The substrate holder 1006 is connected to an oscillating actuator 1010, and the substrate holder 1006 is oscillated by an oscillating actuator 1010 with an amplitude from 0.25 to 25 mm and a frequency from 0.01 to 0.5 Hz. It holds substrate 1004 to move up and down periodically along a direction which is perpendicular to the bottom plane of the metallization apparatus during process. There is a shielding plate 1020 in between the anode 1000 and the substrate 1004 in the metallization apparatus, providing a uniform electrical field distribution across the substrate 1004 surface. The independent power supply 1050 connects to at least one electrode 1000 and works in voltage-controlled mode or current-controlled mode with pre-programmed waveforms, and switch between the two modes at desire time. The applying electrical current is operable in DC mode or pulse reverse mode with pulse period from 5 ms to 2 s. The ultrasonic devices 1002 and 1003 are fixed at the sidewall of the metallization apparatus and at the different side of the shielding plate 1020, to generate the ultrasonic wave with a frequency from 10 KHz to 5 MHz and an intensity from 0.1 to 3 W/cm2.

Figure 4A:
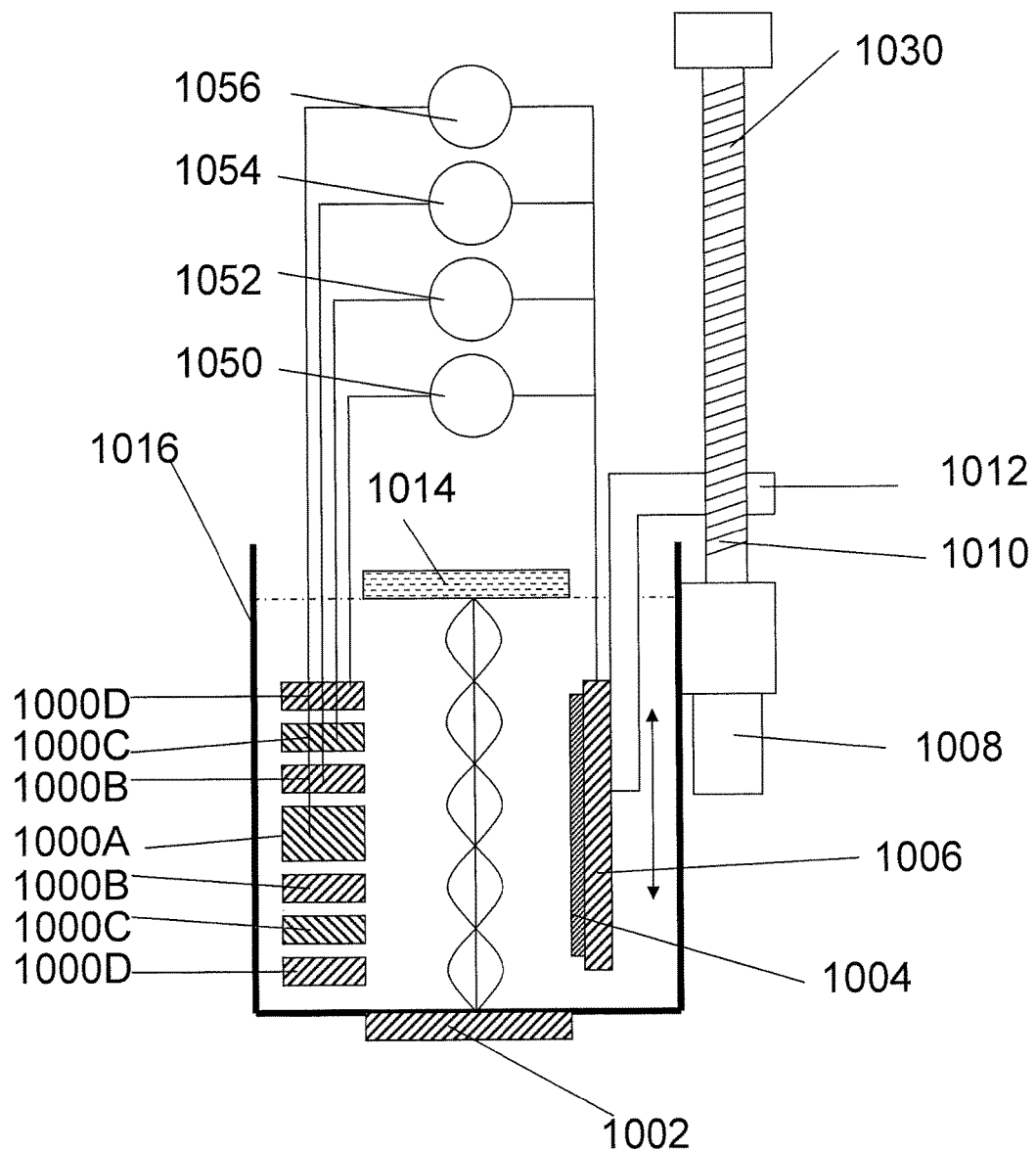
FIGS. 4a-4b show another exemplary apparatus for metallization of substrate from electrolyte solutions and the anode system in the apparatus.
Figure 4B:
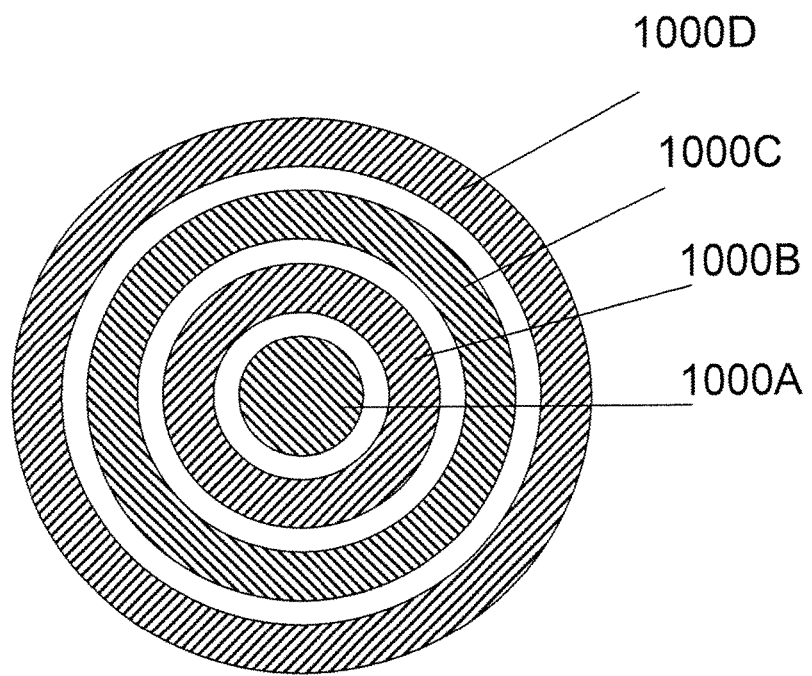

FIG. 4a shows another exemplary apparatus for substrate metallization from electrolyte according to an embodiment of the present invention. The apparatus includes an ultrasonic device 1002. The apparatus for substrate metallization from electrolyte normally comprises an immersion cell 1016 containing at least one metal salt electrolyte, multiple electrodes 1000A, 1000B, 1000C and 1000D connecting to independent power supplies 1050, 1052, 1054, 1056 specifically, an electricity conducting substrate holder 1006 holding the substrate 1004 to expose its conductive side to face said electrodes 1000 A, 1000B, 1000C and 1000D. FIG. 4b shows an exemplary design of the multiple electrodes 1000A, 1000B, 1000C and 1000D. The metal salt electrolyte flows from chamber bottom to chamber top. At least one inlet and one outlet are positioned in the cell for electrolyte circulation. The substrate holder 1006 is connected to an oscillating actuator 1010, and the substrate holder 1006 is oscillated by an oscillating actuator 1010 with an amplitude from 0.25 to 25 mm and a frequency from 0.01 to 0.5 Hz. It holds substrate 1004 to move up and down periodically along a direction which is perpendicular to the bottom plane of the metallization apparatus during process. The independent power supplies 1050, 1052, 1054 and 1056 connect to multiple electrodes 1000A, 1000B, 1000C and 1000D, and work in voltage-controlled mode or current-controlled mode with pre-programmed waveforms, and switch between the two modes at desire time. The applying electrical current is operable in DC mode or pulse reverse mode with pulse period from 5 ms to 2 s. The ultrasonic device 1002 is fixed in a position at the sidewall of the metallization apparatus, to generate the ultrasonic wave with a frequency from 10 KHz to 5 MHz and an intensity from 0.1 to 3 W/cm2.

Figure 5:
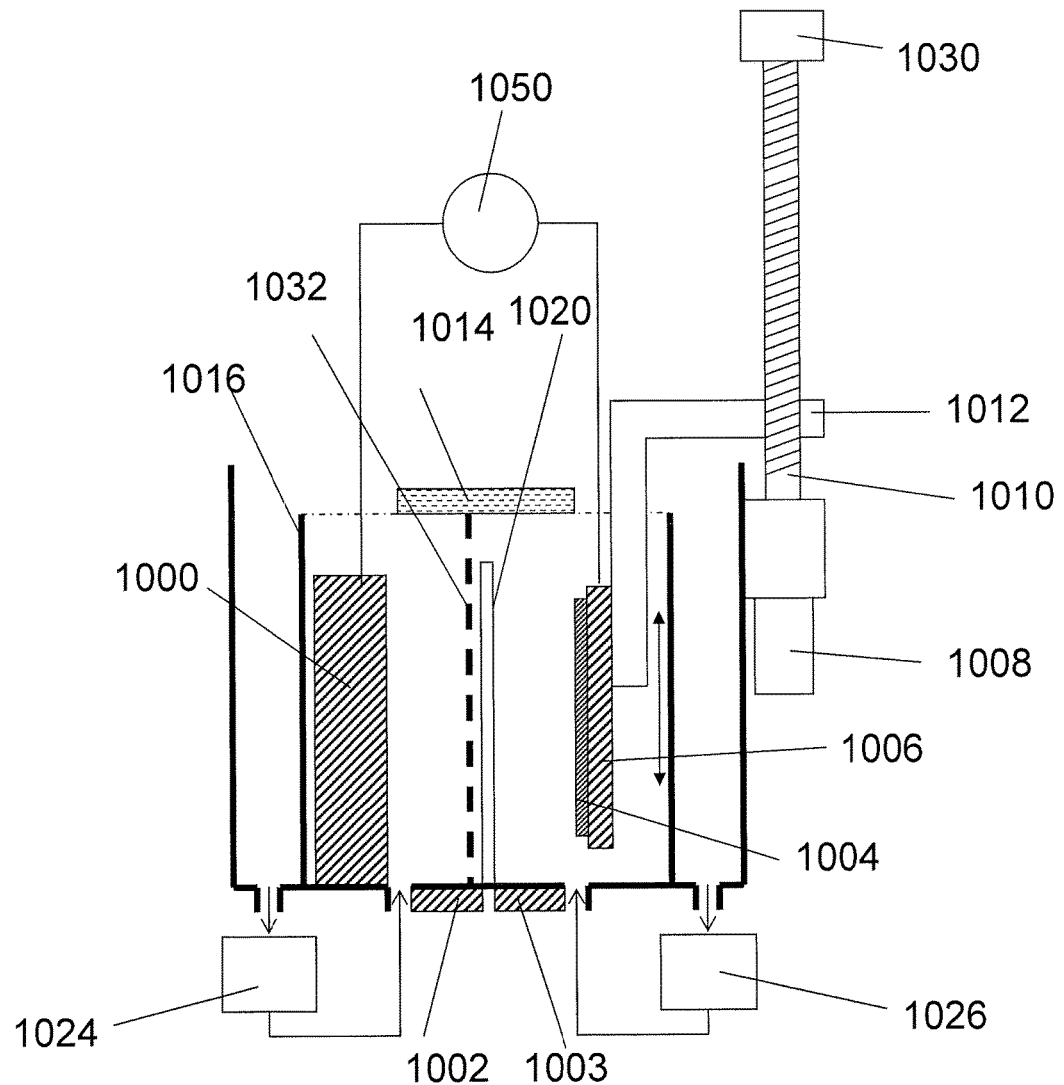
FIG. 5 shows another exemplary apparatus for metallization of substrate from electrolyte solutions.

FIG. 5 shows another exemplary apparatus for substrate metallization from electrolyte according to an embodiment of the present invention. The apparatus includes two ultrasonic devices 1002 and 1003. The apparatus for substrate metallization from electrolyte normally comprises an immersion cell 1016 which is divided into a anode cell and a cathode cell by a membrane 1032, containing one metal salt anolyte and one catholyte, at least one electrode 1000 connecting to independent power supply 1050, an electricity conducting substrate holder 1006 holding the substrate 1004 to expose its conductive side to face said electrode 1000. The metal salt electrolyte flows from chamber bottom to chamber top. One inlet and one outlet are positioned in the anode cell for anolyte circulation with an anolyte circulation mechanism 1024, and another inlet and another outlet are positioned in the cathode cell for catholyte circulation with a catholyte circulation mechanism 1026. The substrate holder 1006 is connected to an oscillating actuator 1010, and the substrate holder 1006 is oscillated by an oscillating actuator 1010 with an amplitude from 0.25 to 25 mm and a frequency from 0.01 to 0.5 Hz. It holds substrate 1004 to move up and down periodically along a direction which is perpendicular to the bottom plane of the metallization apparatus during process. There is a shielding plate 1020 in between the anode 1000 and the substrate 1004 in the metallization apparatus, providing a uniform electrical field distribution across the substrate 1004 surface. The independent power supply 1050 connects to at least one electrode 1000 and works in voltage-controlled mode or current-controlled mode with pre-programmed waveforms, and switch between the two modes at desire time. The applying electrical current is operable in DC mode or pulse reverse mode with pulse period from 5 ms to 2 s. The ultrasonic devices 1002 and 1003 are fixed at the sidewall of the metallization apparatus and at the different side of the shielding plate 1020, to generate the ultrasonic wave with a frequency from 10 KHz to 5 MHz and an intensity from 0.1 to 3 W/cm2.

Figure 6:
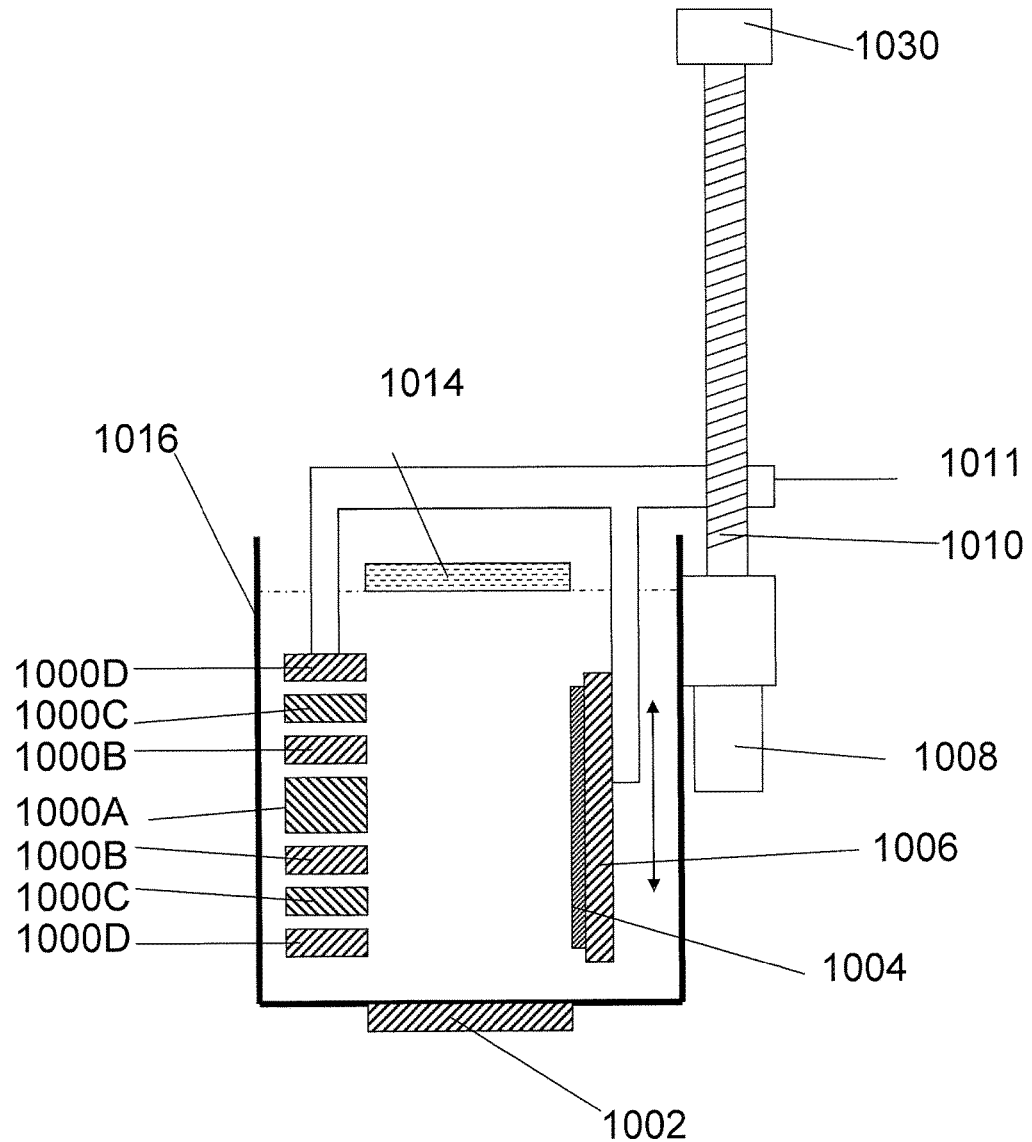
FIG. 6 shows another exemplary apparatus for metallization of substrate from electrolyte solutions.

FIG. 6 shows another exemplary apparatus for substrate metallization from electrolyte according to an embodiment of the present invention. The apparatus includes an ultrasonic device 1002. The apparatus for substrate metallization from electrolyte normally comprises an immersion cell 1016 containing at least one metal salt electrolyte, multiple electrodes 1000A, 1000B, 1000C and 1000D connecting to independent power supplies 1050, 1052, 1054, 1056 specifically, an electricity conducting substrate holder 1006 holding the substrate 1004 to expose its conductive side to face said electrodes 1000A, 1000B, 1000C and 1000D. FIG. 4b shows an exemplary design of the multiple electrodes 1000A, 1000B, 1000C and 1000D. The metal salt electrolyte flows from chamber bottom to chamber top. At least one inlet and one outlet are positioned in the cell for electrolyte circulation. Both the substrate holder 1006 and the multiple electrode system are connected to an oscillating actuator 1010, and the substrate holder 1006 and the multiple electrode system are oscillated by an oscillating actuator 1010 with an amplitude from 0.25 to 25 mm and a frequency from 0.01 to 0.5 Hz. It holds substrate 1004 to move up and down periodically along a direction which is perpendicular to the bottom plane of the metallization apparatus during process. The independent power supplies 1050, 1052, 1054 and 1056 connect to multiple electrodes 1000A, 1000B, 1000C and 1000D, and work in voltage-controlled mode or current-controlled mode with pre-programmed waveforms, and switch between the two modes at desire time. The applying electrical current is operable in DC mode or pulse reverse mode with pulse period from 5 ms to 2 s. The ultrasonic device 1002 is fixed in a position at the sidewall of the metallization apparatus, to generate the ultrasonic wave with a frequency from 10 KHz to 5 MHz and an intensity from 0.1 to 3 W/cm2.

Figure 7A:
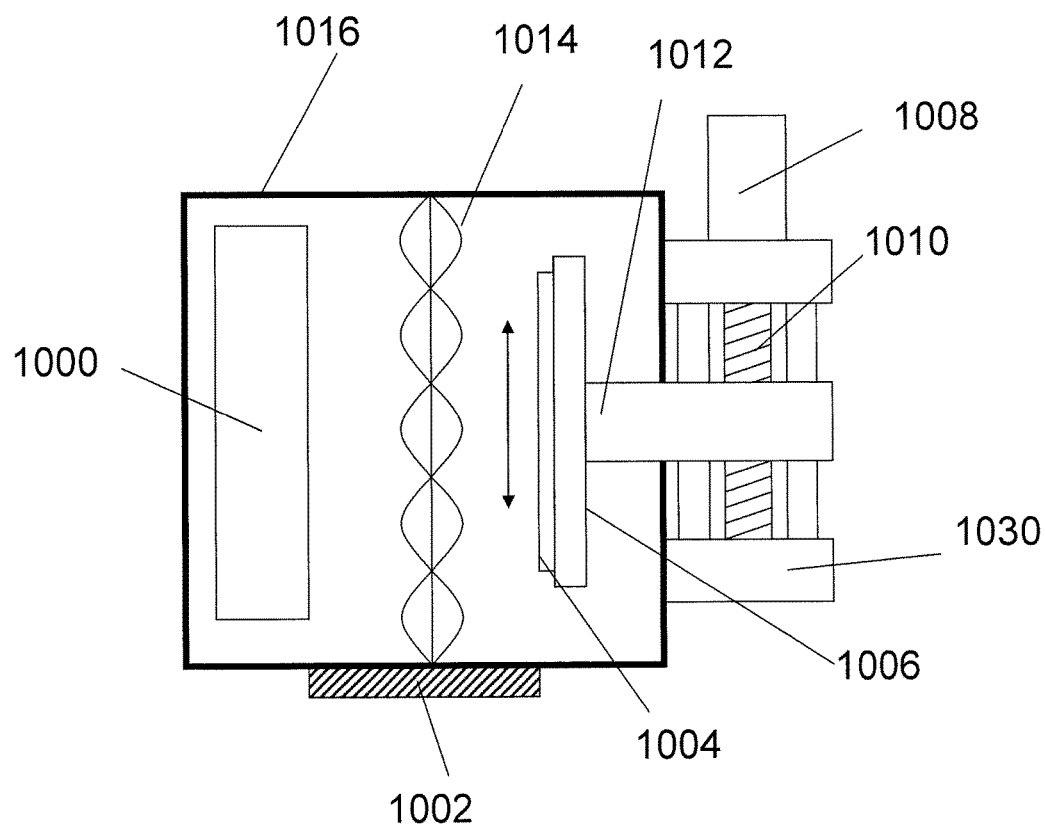
FIG. 7a-7c show another exemplary apparatus for metallization of substrate from electrolyte solutions.
Figure 7B:
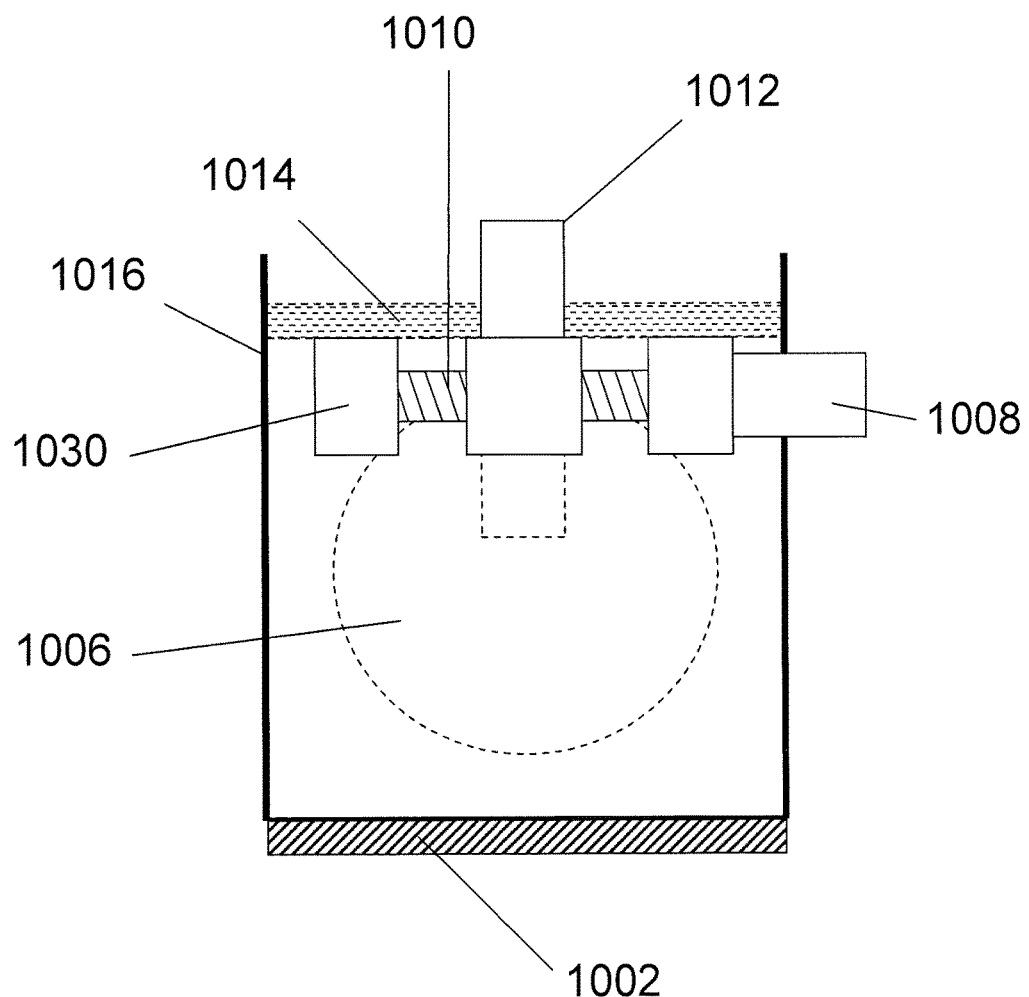
Figure 7C:
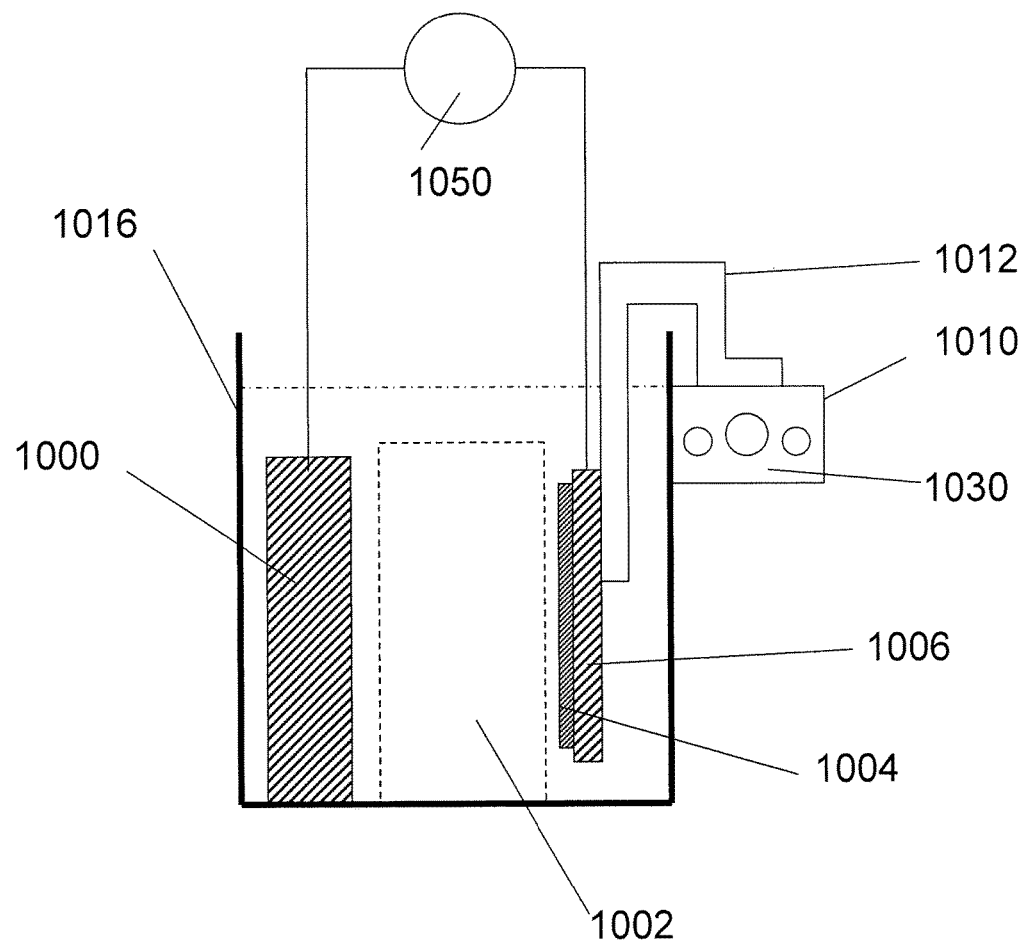

FIG. 7a-7c show another exemplary apparatus for substrate metallization from electrolyte according to an embodiment of the present invention. The apparatus includes an ultrasonic device 1002 at the sidewall of the apparatus. The substrate holder 1006 holds substrate 1004 to move periodically along a direction which is perpendicular to the sidewall plane of the metallization apparatus during process.

Figure 8:
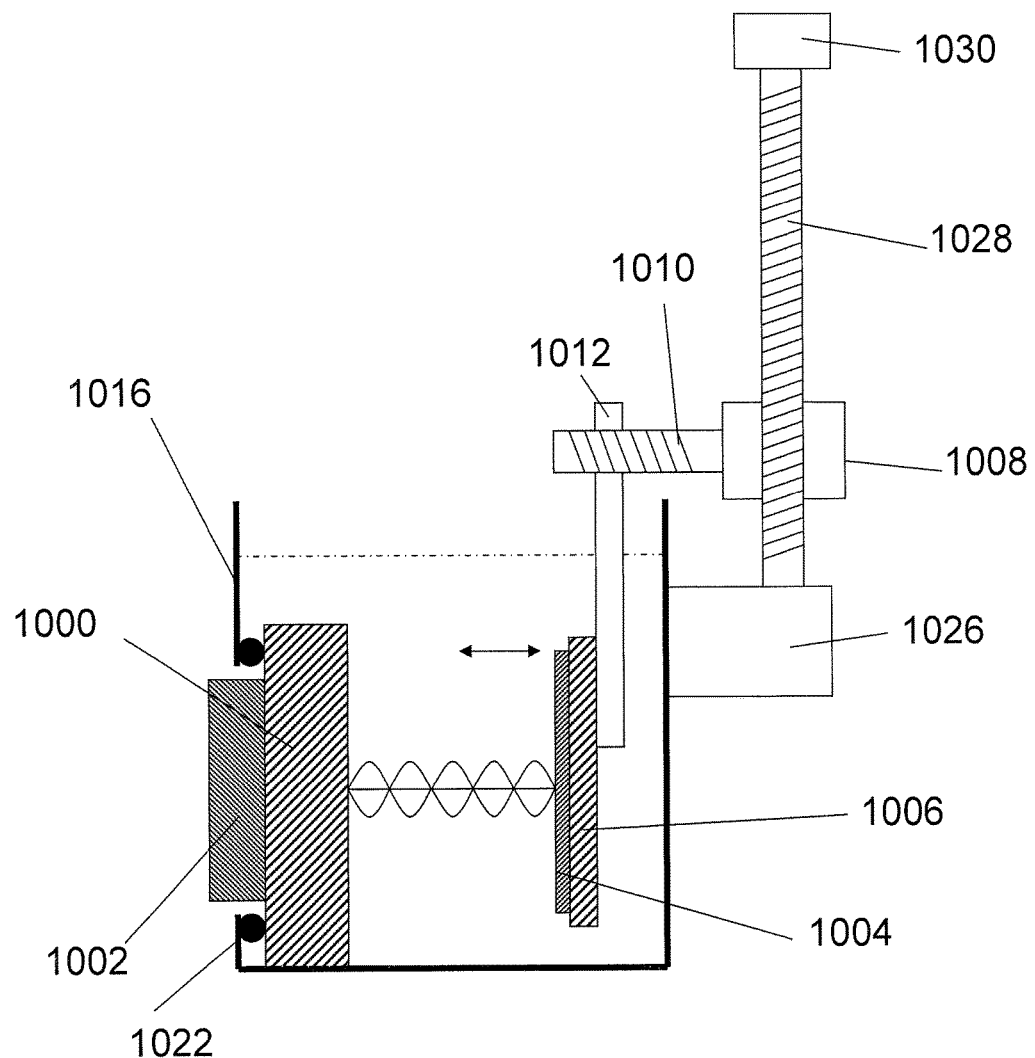
FIG. 8 shows another exemplary apparatus for metallization of substrate from electrolyte solutions.

FIG. 8 shows another exemplary apparatus for substrate metallization from electrolyte according to an embodiment of the present invention. The apparatus includes an ultrasonic device 1002 which is disposed at the anode side and insulated from the electrolyte by an o-ring 1022. The apparatus for substrate metallization from electrolyte normally comprises an immersion cell 1016 containing at least one metal salt electrolyte, at least one electrode 1000, an electricity conducting substrate holder 1006 holding the substrate 1004 to expose its conductive side to face said electrode 1000. The metal salt electrolyte flows from chamber bottom to chamber top. At least one inlet and one outlet are positioned in the cell for electrolyte circulation. The substrate holder 1006 is connected to an oscillating actuator 1010, and the substrate holder 1006 is oscillated by an oscillating actuator 1010 with an amplitude from 0.25 to 25 mm and a frequency from 0.01 to 0.5 Hz. It holds substrate 1004 to move periodically along a direction which is perpendicular to the anode plane of the metallization apparatus during process. The independent power supply 1050 connects to at least one electrode 1000 and works in voltage-controlled mode or current-controlled mode with pre-programmed waveforms, and switch between the two modes at desire time. The applying electrical current is operable in DC mode or pulse reverse mode with pulse period from 5 ms to 2 s. The ultrasonic device 1002 is fixed in a position at the sidewall of the metallization apparatus, to generate the ultrasonic wave with a frequency from 10 KHz to 5 MHz and an intensity from 0.1 to 3 W/cm2.

Figure 9:
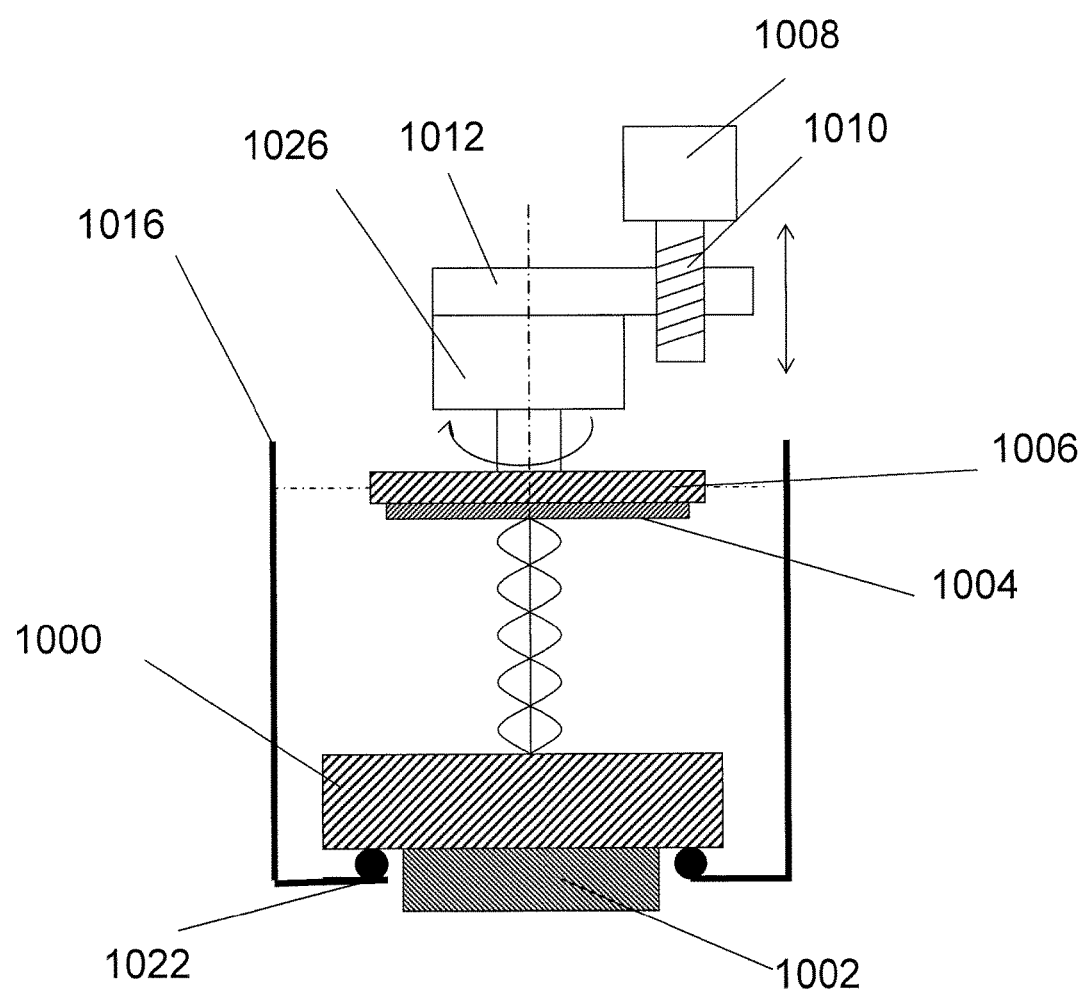
FIG. 9 shows another exemplary apparatus for metallization of substrate from electrolyte solutions.

FIG. 9 shows another exemplary apparatus for substrate metallization from electrolyte according to an embodiment of the present invention. The apparatus includes an ultrasonic device 1002 which is disposed at the anode side and insulated from the electrolyte by an o-ring 1022. The apparatus for substrate metallization from electrolyte normally comprises an immersion cell 1016 containing at least one metal salt electrolyte, at least one electrode 1000, an electricity conducting substrate holder 1006 holding the substrate 1004 to expose its conductive side to face said electrode 1000 and a rotating mechanism 1026 to rotate the substrate holder 1006 during the process. The metal salt electrolyte flows from chamber bottom to chamber top. At least one inlet and one outlet are positioned in the cell for electrolyte circulation. The substrate holder 1006 is connected to an oscillating actuator 1010, and the substrate holder 1006 is oscillated by an oscillating actuator 1010 with an amplitude from 0.25 to 25 mm and a frequency from 0.01 to 0.5 Hz. It holds substrate 1004 to move periodically along a direction which is perpendicular to the anode plane of the metallization apparatus during process. The independent power supply 1050 connects to at least one electrode 1000 and works in voltage-controlled mode or current-controlled mode with pre-programmed waveforms, and switch between the two modes at desire time. The applying electrical current is operable in DC mode or pulse reverse mode with pulse period from 5 ms to 2 s. The ultrasonic device 1002 is fixed in a position at the sidewall of the metallization apparatus, to generate the ultrasonic wave with a frequency from 10 KHz to 5 MHz and an intensity from 0.1 to 3 W/cm2.

Figure 10:
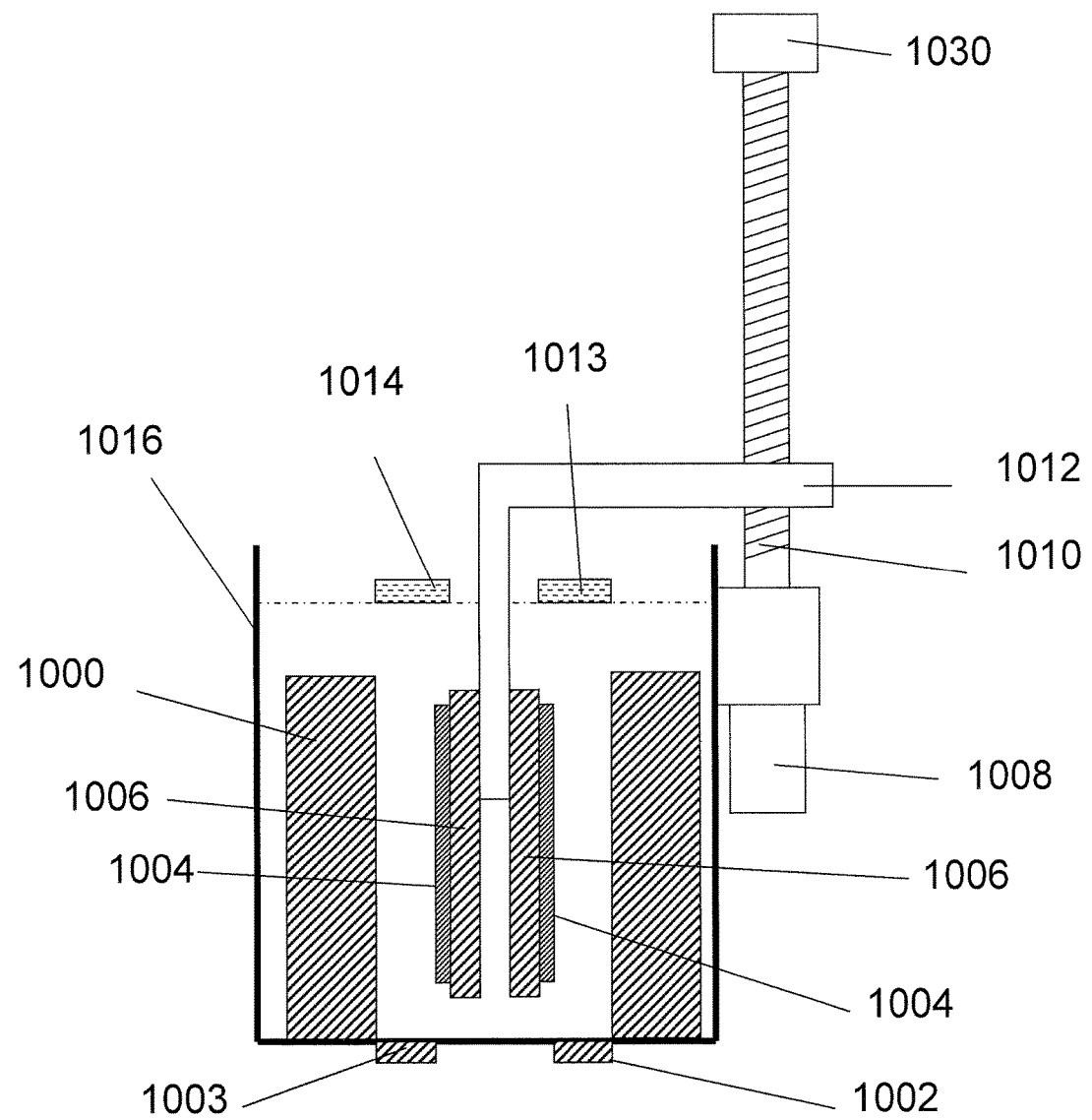
FIG. 10 shows another exemplary apparatus for metallization of substrate from electrolyte solutions.

FIG. 10 shows another exemplary apparatus for substrate metallization from electrolyte according to an embodiment of the present invention. The apparatus includes two ultrasonic devices 1002 and 1003. The apparatus for substrate metallization from electrolyte normally comprises an immersion cell 1016 containing at least one metal salt electrolyte, two electrodes 1000, an electricity conducting substrate holder 1006 holding two substrates 1004 simultaneously to expose their conductive sides to face said electrodes 1000. The metal salt electrolyte flows from chamber bottom to chamber top. At least one inlet and one outlet are positioned in the cell for electrolyte circulation. The substrate holder 1006 is connected to an oscillating actuator 1010, and the substrate holder 1006 is oscillated by an oscillating actuator 1010 with an amplitude from 0.25 to 25 mm and a frequency from 0.01 to 0.5 Hz. It holds two substrates 1004 to move up and down periodically along a direction which is perpendicular to the bottom plane of the metallization apparatus simultaneously during process. The ultrasonic devices 1002 and 1003 are fixed in a position at the sidewall of the metallization apparatus, to generate the ultrasonic wave with a frequency from 10 KHz to 5 MHz and an intensity from 0.1 to 3 W/cm2 for each substrate 1004 independently.

The deposition rate in an electrochemical process is controlled by the mass transport rate of the chemicals at the solid and fluid interface near the semiconductor substrate surface, when a high deposition rate is used and current density is very close to the limiting current density. By Fick's law, reducing the diffusion boundary layer thickness increases the mass transport rate. In a conventional electrochemical deposition chamber, deposition rate can be increased by enhancing the rotation rate of the spin disk to lower the diffusion boundary layer thickness on a surface of the substrate. However, the deposition rate is restricted by the rotation speed increase in a practical application due to the high rotation speed in a fluid chamber generating vortices, gas and splashing during the electrochemical deposition process. The ultrasonic device decreases the diffusion boundary layer thickness by acoustic streaming Hence, it increases the deposition rate without increasing the rotation speed of the substrate. The acoustic boundary layer $\delta a$ introduced by sonic energy is employed to approximate the diffusion layer thickness. It is a function of acoustic frequency f and liquid viscosity v:

$$\delta_a = \left(\frac{2\upsilon}{2\pi f}\right)^{0.5}, \quad (1)$$

Table 1 shows the boundary layer thickness near the substrate with and without sonic device in a low acid copper deposition process. Herein, $Cu^{2+}$ concentration is 0.0625 mol/L, and acid concentration is 1.25E-03 mol/L.

TABLE 1

| Condition | | δ μm |
|---|---|---|
| Spin-Substrate without Sonic Device | 15 RPM | 106.3 |
| | 60 RPM | 53.2 |
| Spin Disk with Sonic Device | 10 kHz | 5.6 |
| | 20 kHz | 4.0 |
| | 80 kHz | 2.0 |
| | 1 MHz | 0.6 |
| | 5 MHz | 0.3 |

A much smaller boundary layer on the substrate surface can be achieved by applying the ultrasonic device in the metallization apparatus, which leads to a higher deposition rate of metal film. And the high rate deposition can be achieved by enhancing intensity or frequency of sonic source.

Another advantage of applying the ultrasonic device in the metallization apparatus is enhancing the chemical exchange rate in small features where convection is limited. With very thin boundary layer and high velocity, the acoustic streaming generated by ultrasonic device can reach to the steady flow area in the small feature, stimulating the vortex destruction and flow regeneration. Furthermore, local flow direction in the vicinity of sonic cavitation sites is isotropic, meaning flow normal to the surface of the substrate also exists, which, in turn, increases the chemical exchange rate by enhancing convection of fresh chemicals and byproducts inside the features. The effect of both thin boundary layer and cavitation-induced convective flow is the freshness of electrolyte mixture in the features, especially for the organic additive molecules, so as to enhance the deposition rate and the bottom-up filling performance. Meanwhile, this also prevents the break-down byproducts generated by electrochemical reactions from being trapped and incorporated into the deposit film, which, in turn, improves the gapfill performance and other physical properties of the deposited film.

However, the distribution of the ultrasonic energy in the electrolyte near the substrate surface is not uniform. While the ultrasonic wave propagates in the electrolyte, the intensity of the ultrasonic wave presents a periodic distribution which generates high energy and low energy spots in the electrolyte with a periodic distribution based on the wavelength of the ultrasonic wave, λ. The non-uniform energy distribution will lead to the non-uniform film deposition rate on the substrate surface. In one embodiment of the present invention, the oscillation actuator 1010, oscillating substrate holder 1006 periodically, is used to keep the acoustic intensity distribution across substrate the same in a cumulative time. The amplitude and frequency of the oscillation can be precisely controlled by the oscillation actuator 1010. It is critical to let each portion of the surface of the substrate receiving same total acoustic intensity in each oscillation, while substrate oscillating N turns in the full process time t. The movement of the substrate in a single oscillating turn changes Δd, determined by the amplitude of oscillation, is $$n \cdot \frac{\lambda}{2},$$

ensuring the intensity going through the minimum to maximum. Therefore, the speed of substrate holder oscillation v should be set at:

$$v = n \cdot \frac{N\lambda}{t}, \quad (5)$$

$$n = 1, 2, 3, \ldots, N = 1, 2, 3 \ldots,$$

where n is an integer number starting from 1, N is the number of revolutions, which is also an integer number.

Figure 11:
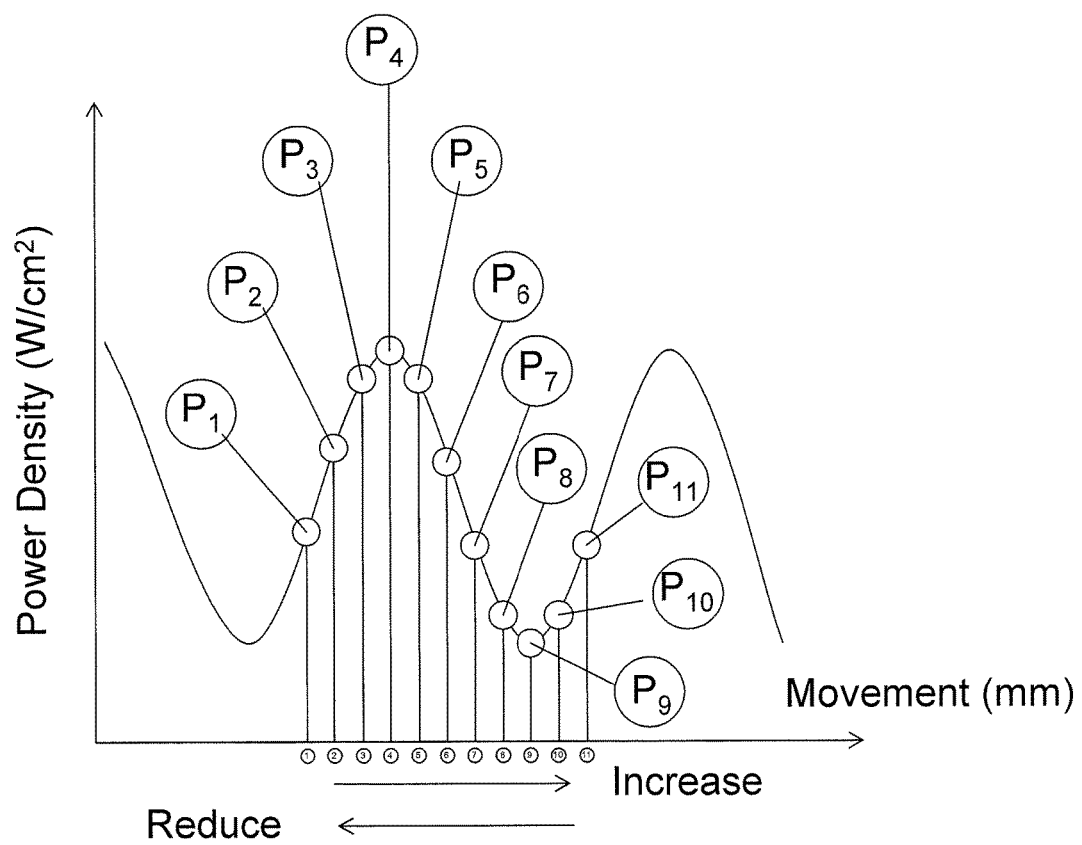
FIG. 11 shows a method of controlling the movement of substrate during the metallization process.

As shown further in detail in FIG. 11, when the position of substrate changes, the acoustic intensity at the same portion of substrate changes from P1 to P2. When the gap increases total half wavelength of sonic wave, the intensity varies a full cycle from P1 to P11. The cycle starting point depends on the position of the portion of substrate in the metallization apparatus. However, each portion on substrate will receive full cycle of intensity when the substrate moves a full distance of $$n \cdot \frac{\lambda}{2}.$$

This will guarantee each location of substrate to receive the same mount of acoustic intensity including the same average intensity, the same maximum intensity, and the same minimum intensity. This further ensures a uniform deposition rate across substrate during the whole electrochemical deposition process.

The method applied to the metallization apparatus with an ultrasonic device can be set as follows:

Process Sequence

Step 1: introduce a metal salt electrolyte into said apparatus;

Step 2: transfer a substrate to a substrate holder with electrical conduction path to substrate conductive layer that is to be exposed to the electrolyte, the substrate holder is electricity conducting;

Step 3: apply a small bias voltage up to 10V to substrate;

Step 4: bring substrate into electrolyte, and the front surface of the substrate is in full contact with the electrolyte;

Step 5: apply electrical current to each electrode; the power supplies connected to electrodes switch from voltage mode to current mode at desired times;

Step 6: maintain constant electrical current on electrode with the electrical current range from 0.1 A to 100 A; in another embodiment, the applying electrical current is operable pulse reverse mode with pulse period from 5 ms to 2 s;

Step 7: turn on ultrasonic device and oscillate substrate holder; the intensity of ultrasonic device is in the range of 0.1 to 3 W/cm$^2$; the frequency of ultrasonic device is set between 5 KHz to 5 MHz; the substrate holder oscillation amplitude range is from 0.01 to 0.25 mm; the substrate holder oscillation frequency range is from 0.01 to 0.25 Hz; the substrate holder oscillation is at constant seed of $$n \cdot \frac{N\lambda}{t},$$

where λ is the wavelength of the ultrasonic wave and t is the full process time. n and N are integers;

Step 8: turn off ultrasonic device and stop oscillation;

Step 9: switch power supply to a small bias voltage mode from 0.1V to 0.5V, and apply it on the substrate;

Step 10: bring the substrate out of the electrolyte;

Step 11: stop power supply and clean off the residue electrolyte on a surface of the substrate.

Although the present invention has been described with respect to certain embodiments, examples, and applications, it will be apparent to those skilled in the art that various modifications and changes may be made without departing from the invention.

What is claimed is:

1. A method for substrate metallization from electrolyte comprising:

flowing a metal salt electrolyte into an immersion cell;

transferring a substrate to a substrate holder that is electrically in contact with a conductive layer on a surface of the substrate;

applying a first bias voltage to the substrate;

applying an electrical current to at least one electrode connecting to at least one power supply, wherein the at least one electrode acts as an anode;

applying an ultrasonic wave to the substrate via at least one ultrasonic device disposed at the side of the anode and oscillating the substrate holder so that the substrate moves periodically along a wave propagation direction with an amplitude and a frequency, wherein the wave propagation direction is perpendicular to the substrate surface and the anode plane, wherein each portion on the substrate receives a full cycle of intensity when the substrate moves a full distance Δd, wherein each location of substrate receives the same amount of acoustic intensity including the same average intensity, the same maximum intensity, and the same minimum intensity, wherein $$\Delta d = n \cdot \frac{\lambda}{2},$$

wherein n is an integer number starting from 1 and λ is the wavelength of the ultrasonic wave;

stopping the application of the ultrasonic wave and stopping oscillation of the substrate holder;

applying a second bias voltage on the semiconductor substrate;

bringing the substrate out of the metal salt electrolyte.

2. The method of claim 1, wherein
the first bias voltage is 0.1V to 10V;
the electrical current is 0.1 A to 100 A;
the ultrasonic wave has an operating frequency of 5 KHz to 5 MHz and an intensity of 0.1 to 3 W/cm$^2$;
the substrate oscillates with an amplitude of 0.25 mm to 25 mm and a frequency is 0.01 to 0.5 Hz;
the second bias voltage is 0.1V to 5V.

3. The method of claim 1 comprising
rotating the substrate and bringing the substrate into contact with the electrolyte, wherein the substrate is rotated at a speed of 10 to 300 rpm.

4. The method of claim 1, wherein the metal salt electrolyte contains at least one cationic form of the following metals: Cu, Au, Ag, Pt, Ni, Sn, Co, Pd, Zn.

5. The method of claim 1, wherein cavities on the substrate have dimensions of 0.5 to 50 μm in width and 5 to 500 μm in depth.

6. The method of claim 1, wherein the substrate holder oscillates at constant speed equal to $$n \cdot \frac{N\lambda}{t},$$

where λ is the wavelength of the ultrasonic wave and t is the full process time, and n and N are integers.

7. The method of claim 1, wherein the electrical current is applied in DC mode.

8. The method of claim 1, wherein the electrical current is applied in pulse reverse mode with a pulse period of 5 ms to 2 s.

9. The method of claim 1, wherein electrolyte agitation is provided proximate cavities on the substrate.

10. The method of claim 1, wherein electrolyte agitation is provided inside cavities on the substrate.

11. The method of claim 1, wherein material exchange rate of reactants and byproducts between the inside and outside of cavities on the substrate are increased.

12. The method of claim 1, wherein impurity levels in deposit in cavities on the substrate are reduced.

13. The method of claim 1, wherein a diffusion boundary layer with a thickness of 0.1 to 10 micrometers is reformed proximate the surface of the substrate.

14. The method of claim 1, wherein metal deposition rate is increased by increasing limiting current density.

15. The method of claim 1, wherein an acoustic intensity received by the substrate is uniform over the course of the method.

16. The method of claim 1, wherein a metalized film with uniform thickness is formed.

\* \* \* \* \*